(12) United States Patent
Dai et al.

(10) Patent No.: US 7,821,350 B2
(45) Date of Patent: Oct. 26, 2010

(54) METHODS AND APPARATUS FOR DYNAMIC FREQUENCY SCALING OF PHASE LOCKED LOOPS FOR MICROPROCESSORS

(75) Inventors: Liang Dai, Carlsbad, CA (US);
Brandon Wayne Lewis, Cary, NC (US);
Jeffrey Todd Bridges, Raleigh, NC (US); Weihua Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 202 days.

(21) Appl. No.: 11/624,995

(22) Filed: Jan. 19, 2007

(65) Prior Publication Data
US 2008/0174373 A1 Jul. 24, 2008

(51) Int. Cl.
*H03L 7/04* (2006.01)
(52) U.S. Cl. .................. 331/179; 331/46; 331/36 C; 331/2
(58) Field of Classification Search .......... 331/2, 331/49, 179, 36 C, 46
See application file for complete search history.

(56) References Cited

U.S. PATENT DOCUMENTS

| | | | | |
|---|---|---|---|---|
| 5,389,898 | A * | 2/1995 | Taketoshi et al. | 331/2 |
| 5,838,205 | A | 11/1998 | Ferraiolo et al. | |
| 6,933,789 | B2 | 8/2005 | Molnar et al. | |
| 7,061,288 | B2 * | 6/2006 | Burgess | 327/156 |
| 7,298,227 | B2 * | 11/2007 | Yu | 331/179 |
| 7,355,485 | B2 * | 4/2008 | Gomez | 331/15 |

2005/0104665 A1 5/2005 Molnar et al.

FOREIGN PATENT DOCUMENTS

WO 0163783 8/2001

OTHER PUBLICATIONS

International Search Report—PCT/US2008/051520—International Search Authority, European Patent Office, May 20, 2008.
Molnar, J. et al.: "W-Band Synthesized Signal Generator Using Fundamental Voltage Controlled Oscillators," Autotestcon, 97. 1997 IEEE Autotestcon Proceedings Anaheim, CA, USE Sep. 22-25, 1997, New York, NY, USA, IEEE, US, Sep. 22, 1997, pp. 331-333, XP010253039, ISBN: 978-0-7803-4162-3.
Molnar J A et al: "W-band synthesized signal generator using fundamental voltage controlled oscillators" Autotestcon, 97. 1997 IEEE Autotestcon Proceedings Anaheim, CA, USA Sep. 22-25, 1997, New York, NY, USA,IEEE, US. Sep. 22, 1997, pp. 331-336, XP010253039 ISBN 978-0-7803-4162-3, p. 331-p. 333; figures 1,2.
International Search Report—PCT/US2008/051520, International Search Authority—European Patent Office May 20, 2008.
Written Opinion—PCT/ US2008/051520, International Search Authority—European Patent Office May 20, 2008.

* cited by examiner

*Primary Examiner*—Benny Lee
*Assistant Examiner*—James E Goodley
(74) *Attorney, Agent, or Firm*—Nicholas J. Pauley; Peter M. Kamarchik; Sam Talpalasky

(57) ABSTRACT

A phase-locked loop employing a plurality of oscillator complexes is disclosed. The phase-locked loop includes a clock output and a plurality of oscillator complexes operable to generate output signals. The phase-locked loop further includes control logic which is configured to selectively couple an output signal of one of the plurality of oscillator complexes to the clock output.

17 Claims, 13 Drawing Sheets

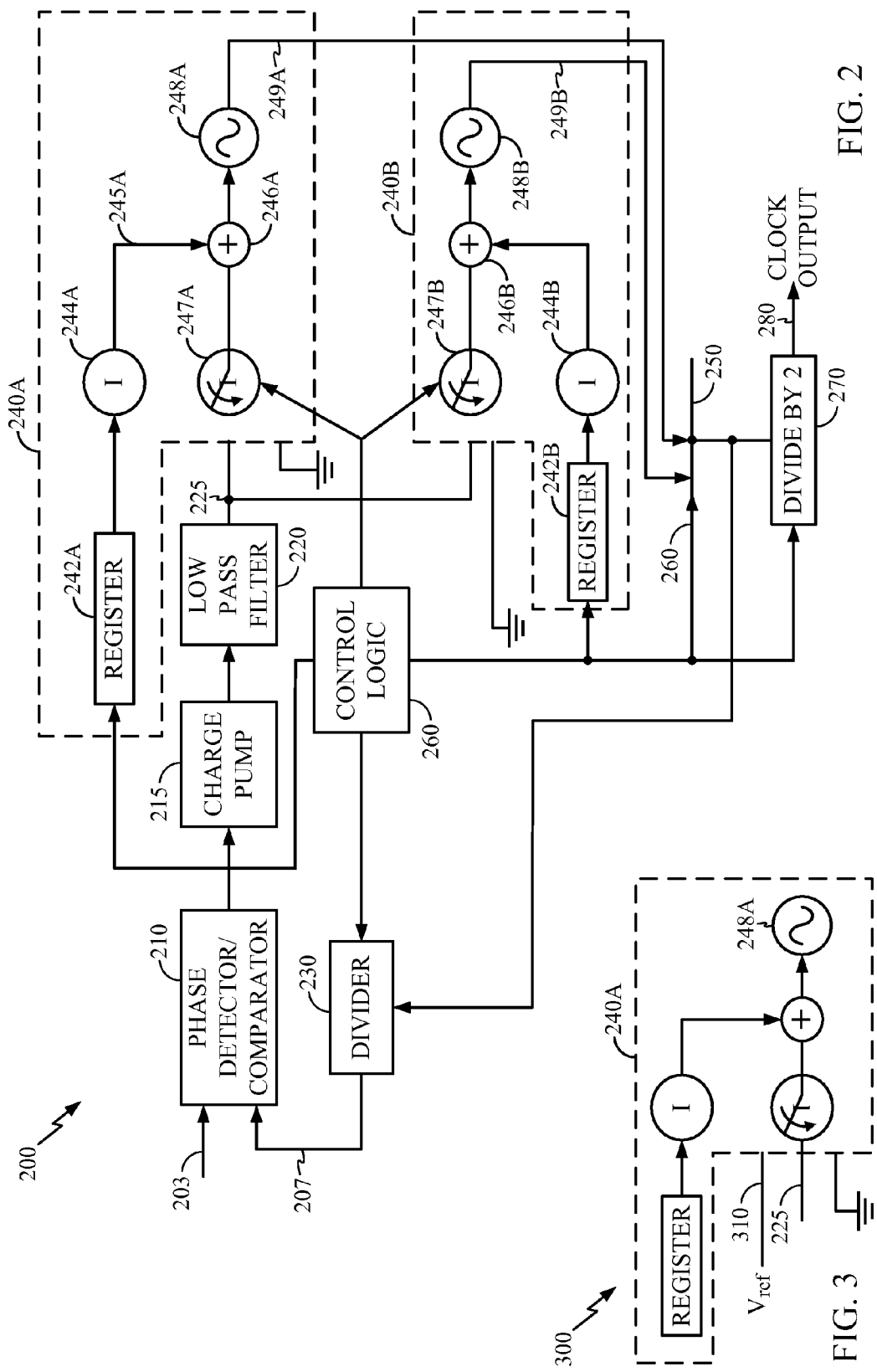

METHODS AND APPARATUS FOR DYNAMIC FREQUENCY SCALING OF PHASE LOCKED LOOPS FOR MICROPROCESSORS

FIELD OF THE DISCLOSURE

The present disclosure relates generally to the field of phase locked loops for clocking microprocessors and, in particular, to a methods and apparatus for dynamic frequency scaling of phase locked loops for microprocessors.

BACKGROUND

Microprocessors perform computational tasks in a wide variety of applications. Improved processor performance is almost always desirable, to allow for faster operation and/or increased functionality through software changes. In many embedded applications, such as portable electronic devices, conserving power is also an important goal in processor design and implementation.

Many modern processors employ dynamic voltage and frequency scaling techniques which include varying the operating frequency and voltage levels of a processor depending on processing demand in order to save energy consumption. When a processor runs off a slower clocking frequency, lower operating voltages may be utilized for charging circuits, resulting in lower power utilization.

One conventional technique for varying frequency includes a programmable phase-locked loop (PLL) which is run at one frequency, suspended from operation, re-programmed to operate at a different frequency while the PLL is suspended, and re-started at the new desired frequency. This approach may cause large current fluctuations between operating frequencies which results in a need to utilize a more robust power supply. It may also result in halting the operation of the processor being driven by the PLL output for many cycles during the re-programming and re-starting phases of operation.

PLLs contain oscillators whose frequency may be voltage controlled or current controlled. Oscillators are designed to operate within a designed operating frequency range. For example, one oscillator may be designed to operate between 400 Mhz and 800 Mhz while another oscillator may be designed to operate between 800 Mhz and 1200 Mhz. A performance tradeoff exists if one were to design an oscillator to operate in the range between 400 Mhz and 1200 Mhz. The width of an operating range for an oscillator is directly proportional to its negative jitter characteristics. Therefore, the larger the operating range for a particular oscillator, the larger its corresponding jitter characteristics. Therefore there is a need to generate varying clock frequencies over a broad range of frequencies having low jitter characteristics.

SUMMARY

In one aspect, a phase-locked loop employing a plurality of oscillator complexes is disclosed. The phase-locked loop includes a clock output and a plurality of oscillator complexes operable to generate output signals. The phase-locked loop further includes control logic which is configured to selectively couple an output signal of one of the plurality of oscillator complexes to the clock output.

In another aspect, a phase-locked loop includes an input for receiving a reference signal, a clock output, and a feedback path for locking a signal in phase with the reference signal. The phase-locked loop further includes a plurality of oscillator complexes operable to generate output signals and separately couple to the feedback path and the clock output. The phase-locked loop also includes control logic configured to selectively couple an output signal of a first one of the plurality of oscillator complexes to the clock output.

In another aspect, a method of varying the frequency of the output of a phase-locked loop is disclosed. In this method, a desired frequency at which an output signal of the phase-locked loop should operate is inputted. An oscillator complex is decoupled from a feedback path of the phase-locked loop. A control of the decoupled oscillator complex is adjusted to generate a signal as output for the phase-locked loop. The oscillator complex is coupled to the feedback path to lock the signal in phase with a reference signal when the signal has a frequency within a range of the desired frequency. In another aspect, a method of varying the frequency of the output of a phase-locked loop is disclosed. In this method, a first oscillator complex is coupled to the output of the phase-locked loop. The first oscillator complex is decoupled from a feedback path of the phase-locked loop. A desired frequency at which an output signal of the phase-locked loop should operate is inputted. A second oscillator complex is powered. The second oscillator complex is digitally controlled to generate a signal in a frequency range containing the desired frequency. The first oscillator complex is decoupled from the output of the phase-locked loop. The second oscillator complex is coupled to the output of the phase-locked loop.

It is understood that other embodiments will become readily apparent to those skilled in the art from the following detailed description, wherein various embodiments are shown and described by way of illustration. As will be realized, the invention is capable of other and different embodiments and its several details are capable of modification in various other respects, all without departing from the teachings of the invention. Accordingly, the drawings and detailed description are to be regarded as illustrative in nature and not as restrictive.

BRIEF DESCRIPTION OF THE DRAWINGS

FIG. 2 is a first embodiment of the phase-locked loop illustrated in FIG. 1.

FIG. 3 is an alternative embodiment of the oscillator complex illustrated in FIG. 2.

DETAILED DESCRIPTION

Figure 1:
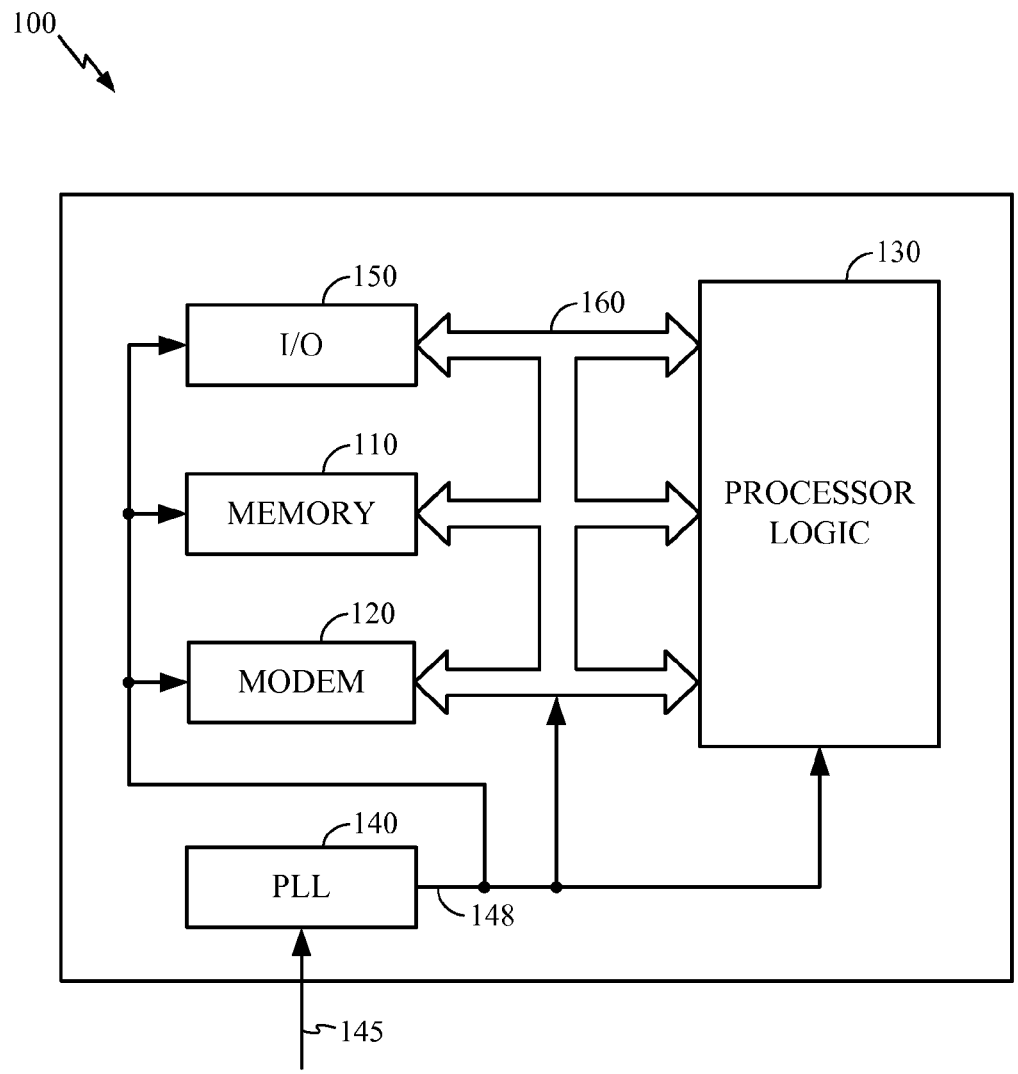
FIG. 1 is a functional block diagram of a processor.

FIG. 1 depicts a functional block diagram of an exemplary processor 100 in which the embodiments may be employed. The processor 100 may be employed in wired devices such as base stations, personal computers (PCs), and the like, and wireless devices such as a mobile phone, laptop, personal digital assistant, pocket PCs, and the like. The processor 100 includes a phase-lock loop (PLL) 140, processor logic 130, a modem 120, memory 110, and Input/Output (I/O) circuitry 150. The modem 120 receives modulated signals and converts them to baseband signals. The memory 110 stores data and instructions for processor logic 130. The processor logic 130 executes instructions stored in memory 110 and sends data and control information to I/O circuitry 150. I/O circuitry 150 includes circuits which interface with displays, audio devices, and the like. The processor logic 130 communicates with the modem 120, memory 110, and I/O circuitry 150 over a bus system 160.

The PLL 140 receives a reference clock signal 145. The reference clock signal 145 may be provided by an oscillating crystal external from the processor 100. The PLL 140 generates a clock signal 148 which is a frequency multiple of the reference signal to trigger the synchronous devices such as the processor logic 130, the modem 120, memory 110, I/O circuitry 150, and the bus system 160. The PLL 140 is programmable and may automatically vary the frequency of the clock signal 148 depending on the processing demands or environmental factors affecting the processor 100. The PLL 140 will be described further in connection with the discussion of FIGS. 2-10.

Those of skill in the art will recognize that numerous variations of the processor 100 are possible. For example, there may be more than one phase-locked loop to separately control various elements within the processor including the bus system 160. In addition, one or more of the functional blocks depicted in the processor 100 may be omitted from a particular embodiment. Other functional blocks that may reside within the components of processor 100 are not germane to the disclosure, and are omitted for clarity. For example, processor logic 130 may include a multi-stage pipeline, a translation lookaside buffer, data cache, and the like.

FIG. 2 is a first embodiment of the phase-locked loop illustrated in FIG. 1. PLL 200 includes a phase detector/comparator 210, a charge pump 215, a low pass filter 220, a divider 230, control logic 260, oscillator complexes 240A-240B, and a glitch free multiplexer 250. Oscillator complexes 240A-240B include oscillators 248A-240B and grossly adjust the output frequency of the oscillators to be within a selected range of frequencies. For the sake of simplicity, only the oscillator complex 240A will be described in detail here, but oscillator complex 240B may suitably be similar and employ similar components except that the oscillator complex 240A includes a current controlled oscillator 248A which is rated to operate in a low end frequency range and the oscillator complex 240B includes a current controlled oscillator 248B which is rated to operate in a high end frequency range.

Additionally, the oscillator complex 240A includes a five bit register 242A, a current control source 244A, a summer 246A, and a controllable switch 247A. In an alternative embodiment, the current control source 244A and current controlled oscillator 248a may be replaced with a voltage control source and a voltage controlled oscillator depending on the particular application and overall design constraints. The oscillator complex 240A is digitally controlled in that the current control source 244A generates a bias current 245A in response to the value of the five bit register 242A. The five bit register 242A is set programmatically and its value may change based on processor load, environmental conditions, or both. A particular value of the five bit register 242A corresponds to a particular range of frequencies within which the clock output of PLL 200 is desired to operate. The current controlled oscillator 248A is designed to oscillate in a low end range approximately between 400 and 800 MHz. By way of example, given the thirty-two different values of five bit register 242A and the 400 MHz operating range of oscillator 248A, each particular value of five bit register 242A corresponds to an output range width of approximately 12.5 MHz. It is noted that the size of the five bit register 242A and, thus, the output range widths, may vary depending on design constraints. When the controllable switch 247A is connected to ground and, for example, the value of the five bit register 242A is two, the oscillator output 249A of current controlled oscillator 248A will be set to a relatively constant value somewhere between 425 MHz and 437.5 MHz. Oscillator output 249A is coupled to the glitch free multiplexer 250 which multiplexes the outputs of oscillator complexes 240A and 240B.

Similarly, with regard to oscillator complex 240B which contains an oscillator 248B designed to oscillate in a higher frequency range, when the controllable switch 247B is connected to ground and, for example, the value of the five bit register 242B is two, the oscillator output 249B of the current controlled oscillator 248B will fluctuate between 825 MHz and 837.5 MHz.

In order to stabilize and lock the clock output, the clock output is fed through a shared feedback path defined by the divider 230, the phase detector/comparator 210, the charge pump 215, and the low pass filter 220. The divider 230 is programmable and divides the multiplexer 250 output by an amount corresponding to the oscillator complex 240A or 240B divided by a reference signal 203 to generate a feedback signal 207.

The phase detector/comparator 210 receives as input a reference signal 203 such as external signal 145 and a feedback signal 207. The phase detector/comparator 210 compares the phase between the external signal 203 and feedback signal 207 to generate a differential signal. The charge pump 215 receives the differential signal and generates a control current. The low pass filter 220 receives the control current and attenuates frequencies higher than a cutoff frequency in order to smooth out the abrupt control inputs from the charge pump 215 to generate an attenuated control current 225.

When oscillator complex 240A is coupled to the low pass filter 220 through programmable switch 247A, the attenuated control current 225 is summed either positively or negatively with bias current 245A. The summed current drives the current controlled oscillator 248A to lock the oscillator signal 249A with the reference signal 203. It is noted that switches 247A and 247B are connected to low pass filter 220 in a mutually exclusive manner. In this embodiment, a locked output results when both the corresponding switch of a oscillator complex is connected to the low pass filter 220 and the output of the same oscillator complex is selected through the glitch free multiplexer 250.

The output of the glitch free multiplexer 250 is directed through an optional divide by two circuit 270 before being sent to synchronous devices. The optional divide by two circuit 270 precludes exposure to synchronous devices which may not be designed to handle high speed transient frequencies and will be described in connection with FIG. 6.

The control logic 260 couples to switches 247A-247B and glitch-free multiplexer 250. To avoid driving the output of the phase-locked loop by multiple oscillators, the operation of switching between the outputs of the oscillator complexes is delayed by three or more oscillator clock cycles. To this end, the control logic 260 may include a finite state machine to ensure that no short pulses or short cycles result when switching the outputs of oscillator complexes 240A-240B through multiplexer 250.

The control logic 260 controls switches 247A-247B independently. In particular, control logic 260 determines whether to connect switches 247A-247B to ground and to the shared feedback path. The control logic 260 also controls the divide by two circuit 270 during a simple slew method of clock ramping described in connection with FIG. 6. The control logic 260 may optionally control the contents of registers 242A and 242B to achieve various clock ramping methods described below. The control logic 260 receives as input information indicating the desired frequency at which the phase-locked loop should operate. This input information may be based on processor load, environmental conditions, or both. The control logic 260 may also report back to the device when the target frequency has been achieved.

FIG. 3 is an alternative embodiment of the oscillator complex 300 illustrated in FIG. 2 being deployed in a phase-locked loop circuit. Oscillator complex 240A may connect to reference voltage $V_{ref}$ 310, the nominal voltage that one would expect from the control loop when locked. Oscillator 248A may couple to $V_{ref}$ 310 during calibration of the register values at initialization of the PLL. During calibration, the reference voltage $V_{ref}$ 310 is set and the gross adjustment currents are stepped through their range. The resultant frequency of the ICOs for each setting of the register is measured. During steady state operation of the PLL, if a new frequency is desired, the register value that produced a frequency closest to that desired frequency with the corresponding $V_{ref}$ input along with the proper divider setting is chosen.

Figure 4:
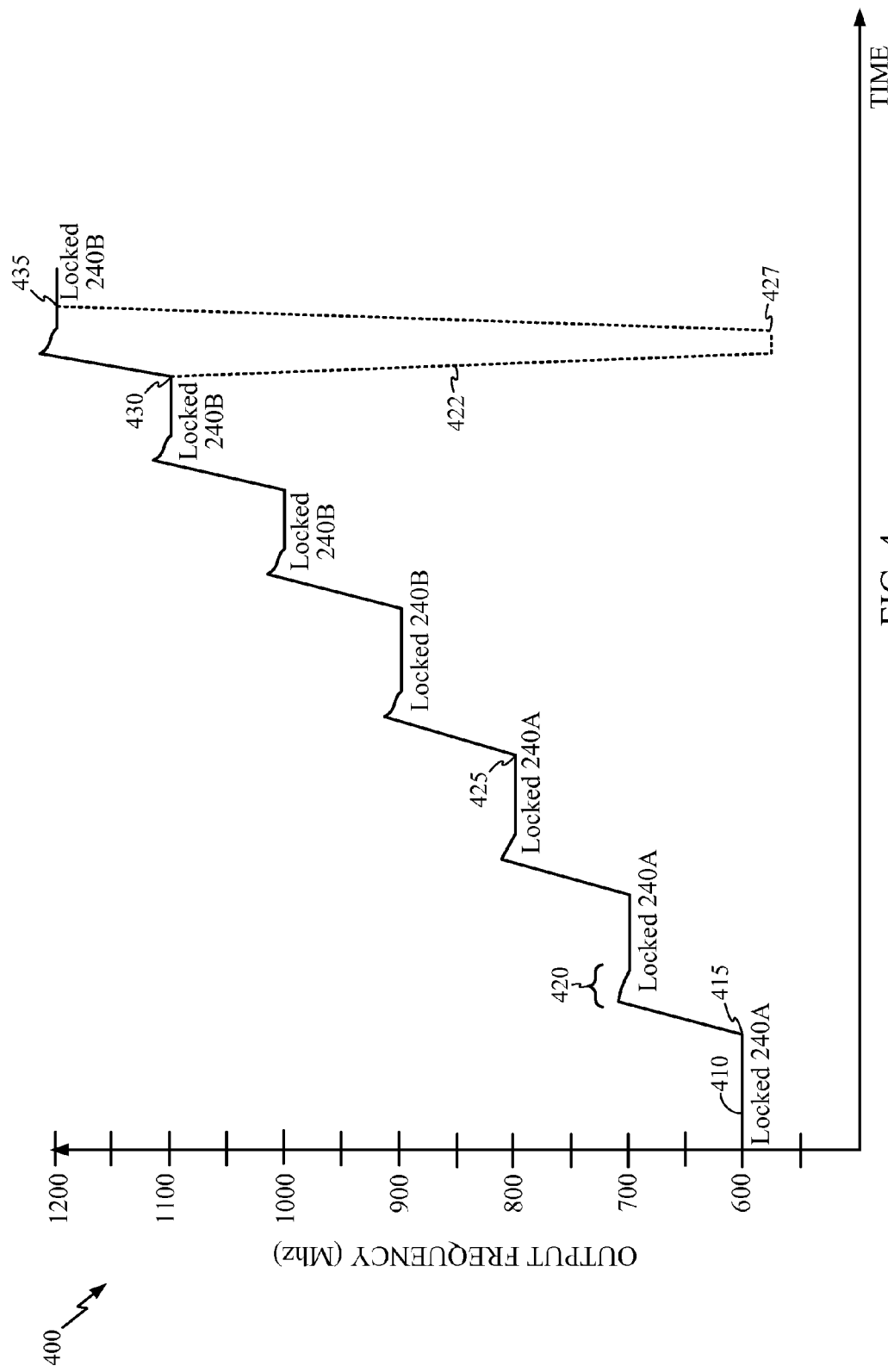
FIG. 4 is a graph of an exemplary output signal of the phase-locked loop of FIG. 1 over time.

FIG. 4 is a graph 400 of the frequency of an exemplary clock output signal of the phase-locked loop of FIG. 1 over time. It should be noted that the solid waveform depicted in FIG. 4 is without the optional divide by two circuit 270 being selected. In this example, the output clock signal at reference 410 is operating at 600 MHz and is desired to be changed to operate at 1.2 GHz. At reference 410, the output clock signal is being driven by oscillator complex 240A. Additionally, the oscillator complex 240A is connected to the low pass filter 220. At reference 415, register 242A is incremented (and a corresponding divider amount is specified for divider 230) to increase the corresponding bias current of oscillator 248A and, thus, causing an increase in the frequency of the output clock signal. During the time 420, the oscillator 248A is in the process of locking with the external reference signal 203. This cycle of operating at a locked output, increasing the bias current and re-locking with by oscillator complexes 240A repeats until reference 425. At reference 425, it is desired to increase the clock output frequency past the rating of oscillator 248A. At 425, control logic 260 sets the bias by setting register 242B, sets the divider amount, selects oscillator complex 240B to drive the clock output by switching switch 247A to ground, switches switch 247B to the feedback path, and selects oscillator output 249B to drive the clock output. The oscillator complex 240B steps up to 1.2 GHz by having register 242B incremented over three more cycles.

At reference 430, in one embodiment, the optional divide by two circuit 270 is not utilized. In this embodiment, the output clock signal 280 will track the oscillator output 249B (illustrated as the solid line in FIG. 4). This embodiment has particular application when the synchronous circuits being driven by the output clock signal 280 are designed to handle overshoot at high frequencies.

In another embodiment, at reference 430, control logic 260 increments register 242B to reach its target operating frequency. Also at reference 430, control logic 260 activates the divide by two circuit 270 to halve the output clock frequency as shown by dashed line 422. At reference 435, the oscillator output 249B becomes locked with the reference signal 203. At reference 427, control logic 260 deactivates the divide by two circuit 270 to allow the clock output to rise to the locked output target frequency.

It is noted that although a divide by two circuit 270 is shown in FIG. 1, other dividers may be utilized including a fractional divider or any other divider circuit which reduces the frequency of the output clock signal. Dropping the clock output frequency to allow the oscillator to lock on to the target frequency protects synchronous circuits which may not be designed to handle frequency overshoot at such a high operating frequency. Even if synchronous circuits are designed to handle overshoot of the target frequency such design typically requires increasing the operating voltage of the synchronous circuits to do so. Dropping the clock output frequency as described eliminates the need for operating synchronous circuits utilizing this increased operating voltage.

Figure 5:
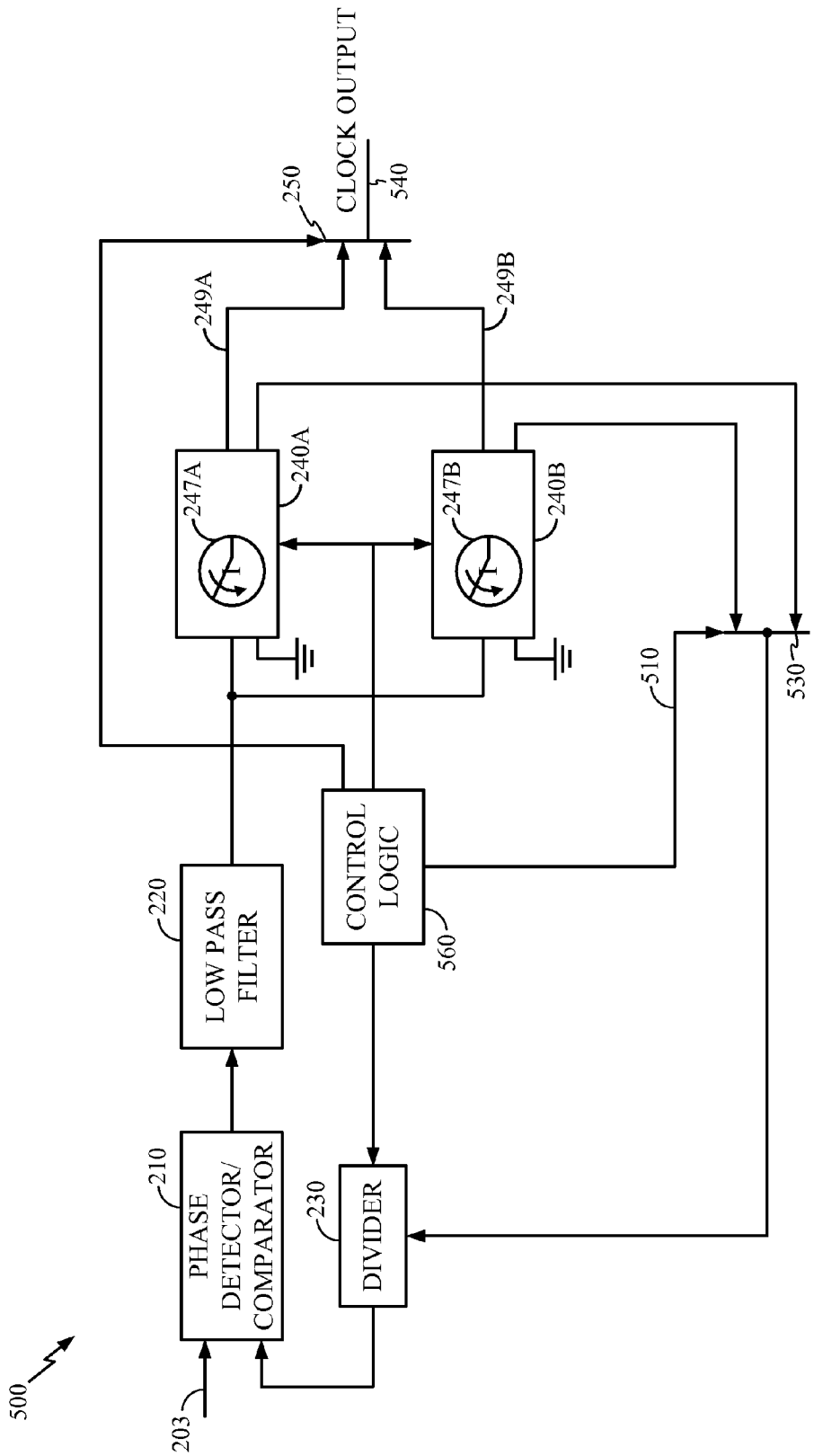
FIG. 5 is a second embodiment of the phase-locked loop illustrated in FIG. 1 which selectively couples two oscillators to the feedback and output paths.

FIG. 5 is a second embodiment of the phase-locked loop illustrated in FIG. 1 which selectively couples two oscillators to the feedback and output paths independently. FIG. 5 contains all the elements described in FIG. 1 with the exception of the divide by two circuit 270. Additionally, phase-lock loop 500 includes a glitch free multiplexer 530 which provides for independent coupling of oscillators between the feedback path defined by the divider 230, phase detector 210, low pass filter 220, and the output of one of the oscillator complexes 240A-240B. By way of example, control logic 560 may be configured to select the output of oscillator complex 240A to be connected to clock output 540 by controlling glitch free multiplexer 250 while selecting the output of oscillator complex 240B to be connected to the feedback path by controlling glitch free multiplexer 530 and switch 247B. Phase-lock loop 500 eliminates overshoot when the clock output changes between being driven by oscillator complexes. Furthermore, this embodiment allows the clock output to be run unlocked as described in connection with FIG. 6.

Figure 6:
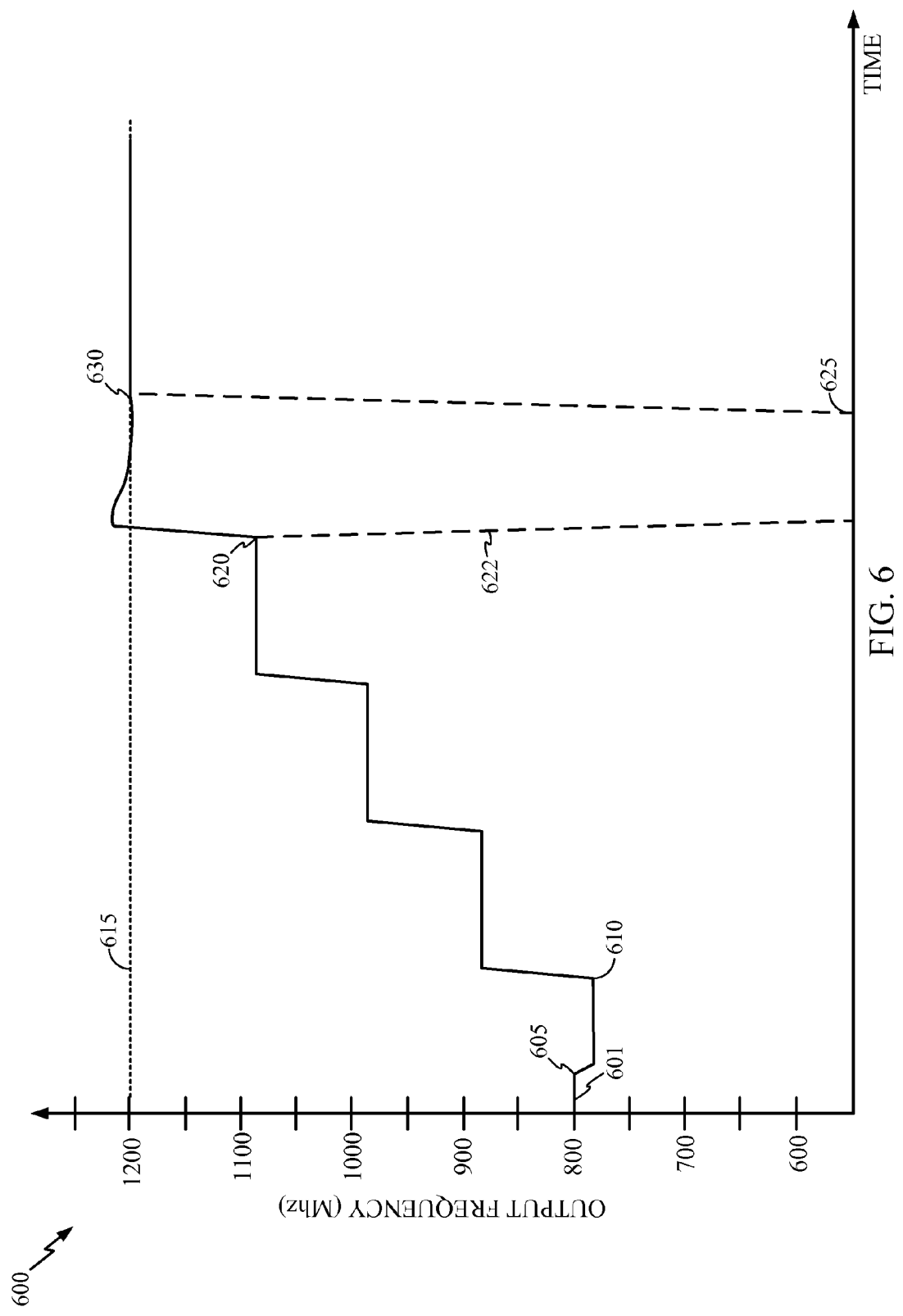
FIG. 6 is a graph of an exemplary output signal illustrating a simple slew operation of a phase-locked loop.

FIG. 6 is a graph 600 of an exemplary output clock signal implementing a simple slew method of output clock variation in order to reach a target frequency 615. Graph 600 plots the oscillator output for oscillator complex 240B and the output clock signal 540 in the frequency domain. In graph 600, the output clock signal 540 is being driven by oscillator complex 240B. At reference 601, the oscillator complex 240B output drives the output clock signal 540 to operate at 800 MHz. At reference 605, the simple slew technique begins by switching 247A to ground and selecting oscillator complex 240A to connect to the feedback path. As a result, the frequency of the oscillator complex 240B and, thus, the output clock signal 540 drops and runs unlocked at a slightly lower frequency. The term unlocked refers to driving the clock output of a PLL by an oscillator that is not coupled to the feedback path of the PLL. Those of ordinary skill in the art will appreciate that the term unlocked can also include decoupling one signal of a PLL from the feedback path of a phase lock loop. It is noted that an unlocked clock output for a specified bias voltage generally operates at a frequency less than a locked output for the same specified bias voltage.

The drop is still within the range defined by the value in register 242B due to the oscillator complex 240B. At reference 610, register 242B is incremented by control logic 560 causing both the oscillator output 249B and the output clock signal 540 to increase to operate in the next operating frequency range. In other embodiments, the increase in operating frequency range may include jumping over the next operating frequency range. Register 242B is continually incremented to achieve an output frequency of approximately 5 MHz/µsec. Since the phase-locked loop is operating while unlocked, the operating frequency at each increment is a little lower than it would be had it been operating locked. Furthermore, while oscillator complex 240B is driving the output without coupling to the feedback path, the divider amount is immaterial during the ramping of oscillator complex 240B.

It is further noted that the size of increase between each clock output level or step illustrated in FIGS. 4 and 6 are selected for illustrative purposes and may not directly map to the frequency width ranges defined by the five bit register values. Furthermore, the frequency characteristics of oscillators are not as linear as shown in FIGS. 4 and 6. The oscillator frequency curve is typically bowed but, it is monotonic as illustrated.

Figure 7:
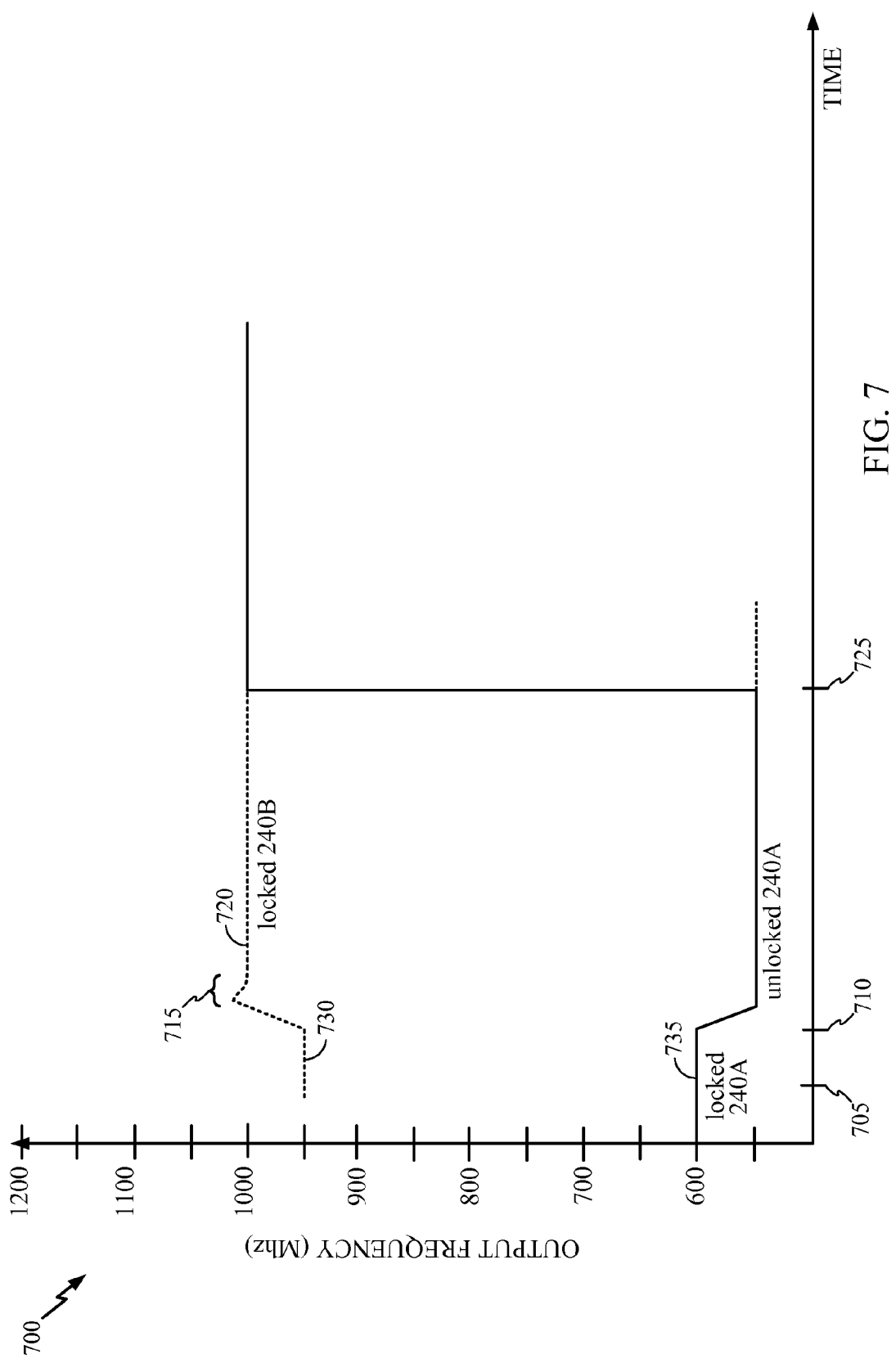
FIG. 7 is graph of an exemplary output signal illustrating a hop operation of a phase-locked loop.

FIG. 7 is graph 700 of an exemplary output signal illustrating a hop method of clock variation to reach a target frequency of 1 GHz. The clock output illustrated in FIG. 7 may be suitably generated by phase-lock loop 500. Graph 700 illustrates a hop from an operating clock output of 600 MHz to 1 GHz. Graph 700 plots the output frequency 735 of oscillator complex 240A and the output frequency 730 of oscillator complex 240A. The solid line indicates the output clock frequency 540 of the phase-lock loop 500. The dotted line indicates that the respective oscillator complex is not selected to be the output of the phase-lock loop 600.

At time 705, the oscillator complex 240A is locked at 600 MHz and is selected to drive the clock output. Also, the oscillator complex 240B is operating unlocked and unselected at under 1 GHz. If the oscillator complex 240B is not already powered on, the corresponding register may be modified to a value that would cause the oscillator complex 240B to operate at under 1 GHz. At time 710, the feedback loop is disconnected from the oscillator complex 240A, unlocking its operation and causing the clock output to drop from 600 MHz. Also, the feedback loop is connected to the oscillator complex 240B and the divider amount for divider 230 is specified, raising the output of the oscillator complex 240B. During time period 715, the oscillator complex 240B is in the process of locking with reference signal 203. Meanwhile, the output of oscillator complex 240A remains selected to drive the clock output at less than 600 MHz. At time 725 after oscillator complex 240B has locked, control logic 560 selects the oscillator complex 240B to drive the clock output by switching multiplexer 250 causing the clock output to increase from under 600 MHz to 1 GHz without overshoot experienced by the clock output signal. The oscillator complex 240A may be powered down while oscillator complex 240B drives the clock output until the next target frequency is to be provided by oscillator complex 240A.

It should be noted that phase-lock loop 500 may generate clock output which hops between any two combinations of output clock frequencies in either direction where one output clock frequency is driven by one oscillator complex and the other output clock frequency is driven by the other oscillator complex.

Figure 8:
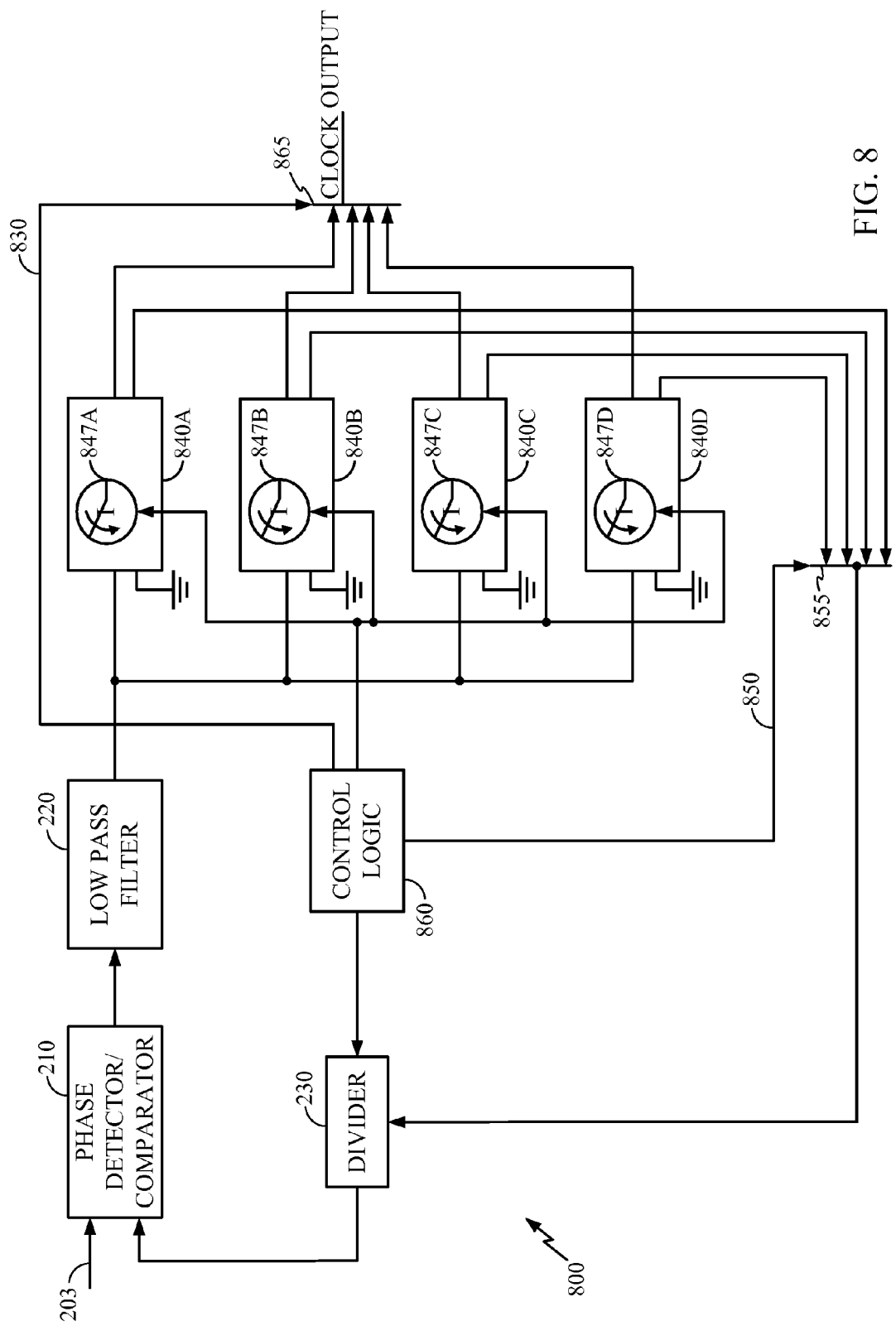
FIG. 8 is a third embodiment of the phase-locked loop illustrated in FIG. 1.

FIG. 8 is a third embodiment of the phase-locked loop illustrated in FIG. 1. Phase-locked loop 800 includes similar feedback elements as described in FIG. 2. Phase-locked loop 800 also includes oscillator complexes 840A-840D, control logic 860, and glitch free multiplexers 855 and 865. Oscillator complexes 840A and 840B, collectively referred to as low end oscillator complexes, are rated to oscillate signals at frequencies between 400 MHz and 800 MHz. Oscillator complexes 840C and 840D, collectively referred to as high end oscillator complexes, are rated to oscillate signals at frequencies between 800 MHz and 1200 MHz. Each of the oscillator complexes are coupled to multiplexers 855 and 865. Control logic 860 is configured to connect any one of the oscillator complexes to the clock output of the phase-locked loop 800. Additionally, control logic 860 is configured to independently connect any one of the oscillator complexes to the feedback path of the phase-locked loop 800. Control logic 860 may connect the same oscillator complex to both the clock output and the feedback path or may connect one oscillator complex to the feedback path and another oscillator complex to the clock output.

Figure 9:
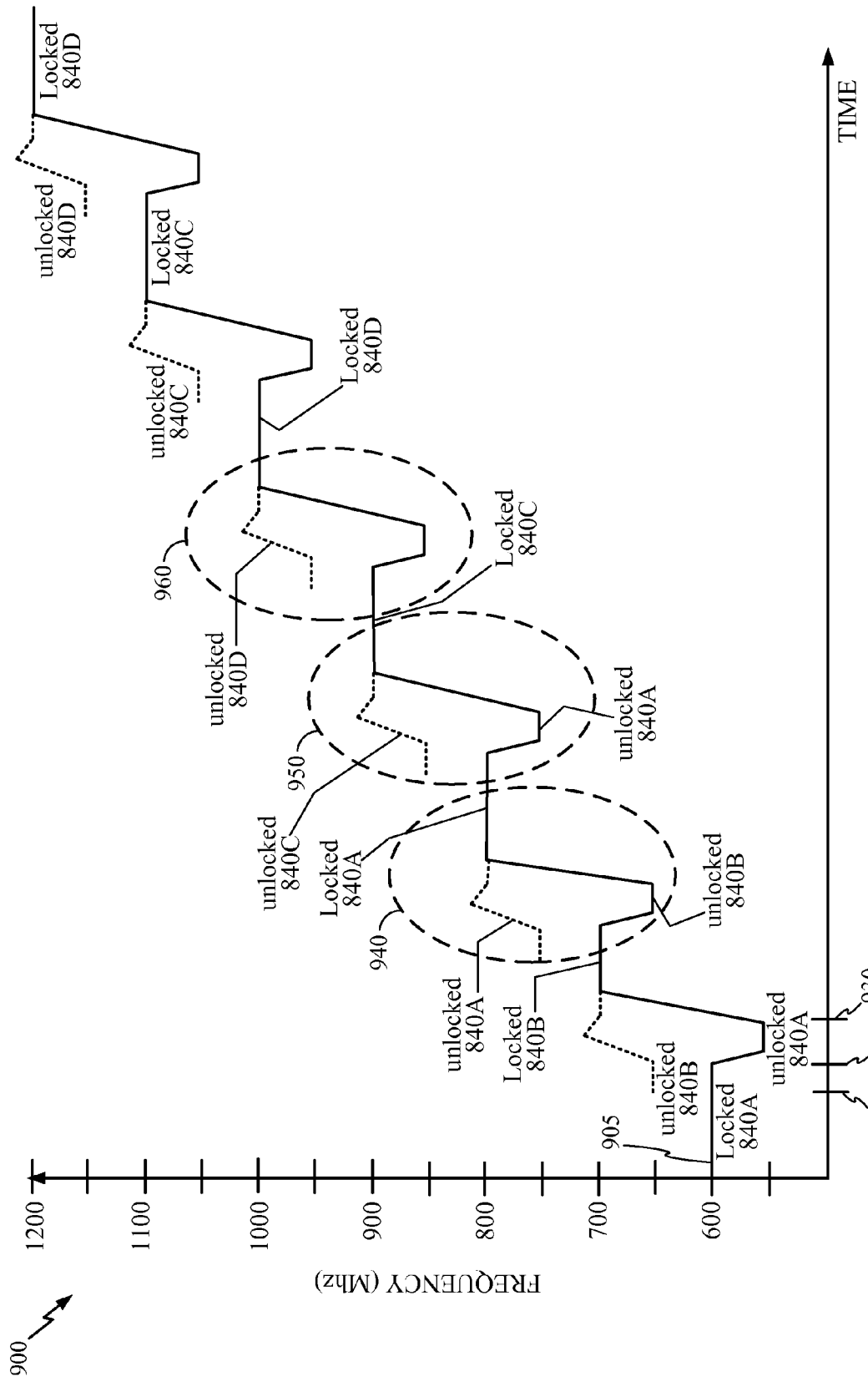
FIG. 9 is graph of an exemplary output signal illustrating a locked slew operation of a phase-locked loop.

Control logic 860 may produce various clock slewing methods by varying which oscillator drives a feedback path and which oscillator drives the PLL output. FIG. 9 is graph of an exemplary output signal illustrating a locked slew method generated by the phase-locked loop 800. Control logic 860 controls a sequence of connecting and disconnecting oscillator complexes of the same range (i.e. low end oscillator complex) in order to step up the output clock frequency. By doing so, clock output 905 is generated by switching between oscillator complexes.

In reading FIG. 9, the solid line indicates the output clock 905 of the phase-lock loop 800. The dotted line indicates that the respective oscillator complex is not selected to be the output of the phase-lock loop 800.

Before time 910, oscillator complex 840A is locked and selected to drive the clock output 905. At time 910, the oscillator within the oscillator complex 840B, the other low end bias circuit, is powered on and is unlocked. Oscillator complex 840B is initialized by its register to operate within the frequency range around 700 MHz. At time 920, control logic 860 disconnects oscillator complex 840A from the feedback path, resulting in the clock output 905 to drop. Also, at time 920, control logic 860 connects oscillator complex 840B to the feedback path and programs the divider 230, resulting in the output of the oscillator complex 840B to increase to about 700 MHz.

At time 930, the oscillator complex 840B becomes locked. The control logic 860 disconnects oscillator complex 840A from the clock output and connects oscillator complex 840B to the clock output, resulting in a step up to frequency of 700 MHz without the clock output experiencing a frequency overshoot. In this exemplary output signal 905, this cycle of flopping between oscillator complexes repeats five more times until the clock output 905 is operating at 1.2 GHz. FIG. 9 also illustrates flopping between low end oscillator complexes (illustrated as region 940), high end oscillator complexes (illustrated as region 960), and between a low end low end oscillator complexes and high end low end oscillator complex (illustrated as region 950).

Figure 10:
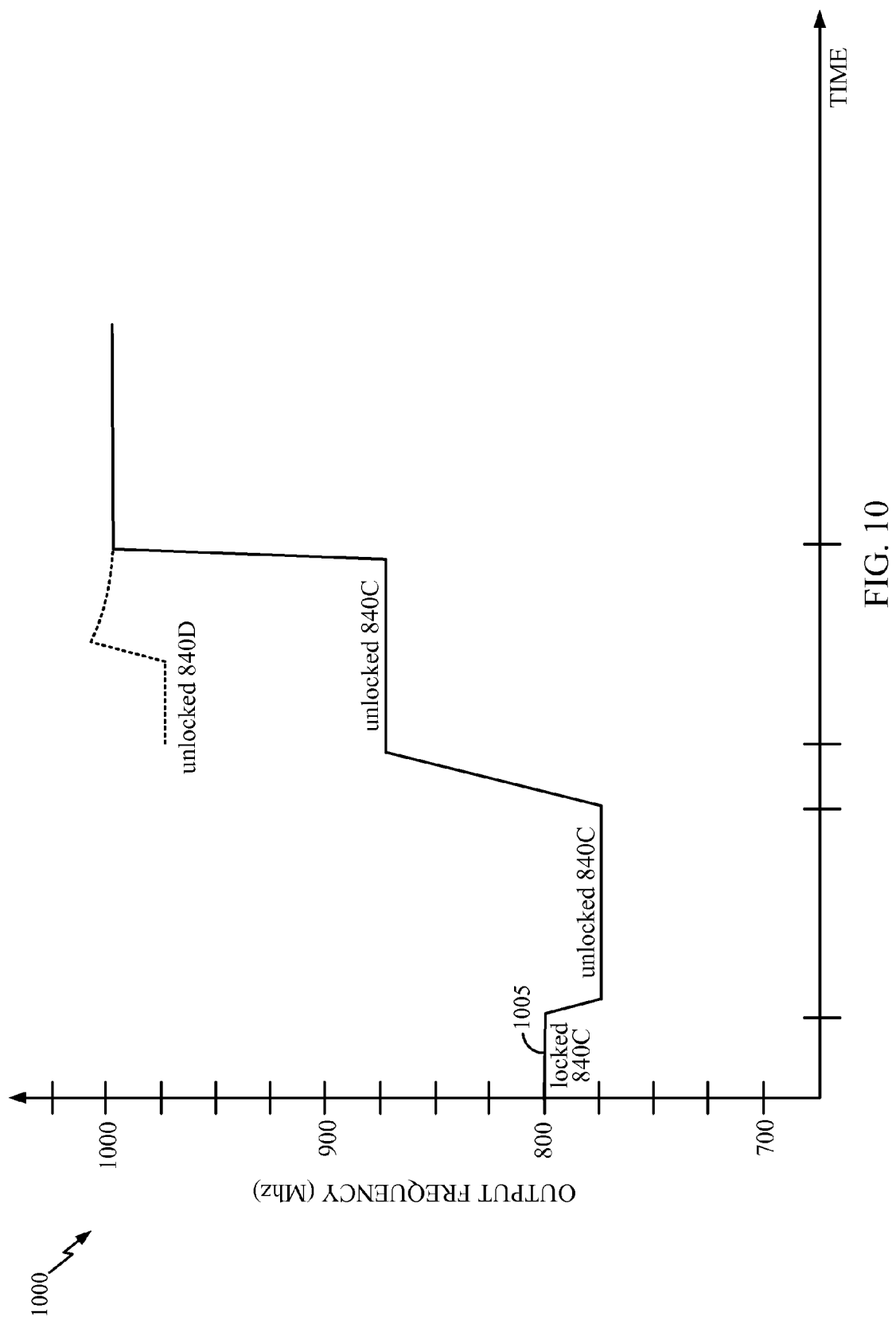
FIG. 10 is a graph of an exemplary output signal illustrating a complex slew operation of a phase-locked loop.

FIG. 10 is a graph of an exemplary output signal 1005 illustrating a complex slew method of varying a phase-locked loop output. The complex slew method is similar to simple slew method described in FIG. 6 except phase-locked loop 800 removes overshoot from the clock output signal by switching to another oscillator complex. Although the above exemplary clock output waveforms have been illustrated as generally progressing in an ascending manner, those of ordinary skill in the art will appreciate that the exemplary clock output waveforms may alternatively progress in a descending manner.

Figure 11:
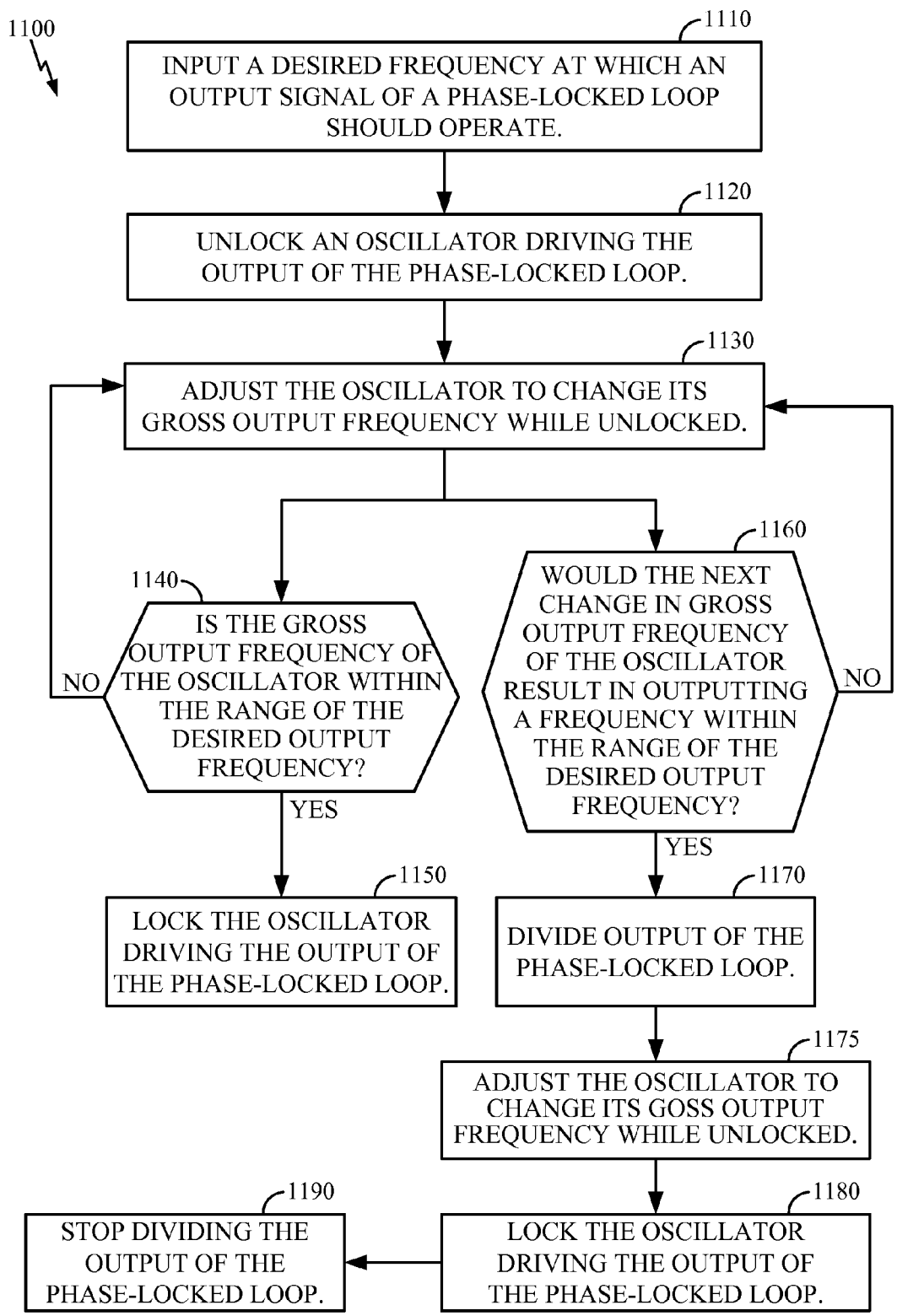
FIG. 11 is a flow chart illustrating a simple slew method for varying the frequency of the output of a phase-locked loop.

FIG. 11 is a flow chart illustrating a simple slew method 1100 for varying the frequency of the output of a phase-locked loop. At block 1110, a desired frequency at which an output signal of a phase-locked loop should operate is presented. By way of example, the load of a processor may have increased, thus, requiring faster clock cycles to process the load in a shorter period of time. At block 1120, an oscillator driving the output of the phase-locked loop is unlocked from a reference signal such as reference signal 203. Unlocking the driving oscillator, results in a drop of frequency at the output of the phase-locked loop. At block 1130, a digital control means such as register 242A which controls the driving oscillator to change its gross output frequency is modified, causing the output signal of the phase-locked loop to either increase or decrease in frequency depending on the change in the driving oscillator. Two embodiments of a simple slew method are illustrated in FIG. 11. Blocks 1140 and 1150 define one embodiment while blocks 1160, 1170, 1180, and 1190 define another embodiment.

At block 1140, the method 1100 determines whether the gross output frequency of the oscillator is within the range of the desired output frequency. By way of example, a desired frequency may specify 1.1 GHz. The method determines if the range defined by the register value which controls the corresponding oscillator complex includes the 1.1 GHz frequency. If it is, the method 1100 proceeds to block 1150 where the driving oscillator is locked with the reference signal by setting a divider amount and coupling the driving oscillator to a feedback path of the phase-locked loop. If it is not, the method 1100 proceeds to block 1130 to modify the digital means such as the register value in register 242A. If it is desired to slew the output of the phase-locked loop higher, the increased register value will cause the output of the clock to jump up to the next gross frequency range. If it is desired to slew the output of the phase-locked loop lower, the decreased register value will cause the output of the clock to jump down to the next gross frequency range.

In the second embodiment and returning to block 1130, the method 1100 proceeds to block 1160. At block 1160, the method 1100 performs a look ahead function by determining whether the next change in gross output frequency of the oscillator would result in outputting a frequency within the range of the desired output frequency. If it would not, the method 1100 proceeds to block 1130 where the oscillator is adjusted to operate in the next frequency range. If it would, the method 1100 proceeds to block 1170 where the output of the phase-locked loop is divided. For example, the output may be divided by enabling a divide by two circuit such as circuit 270. The divide by two circuit, in one embodiment, may be enabled before the last unlocked step. In another embodiment, the divide by two circuit may be enabled after the last unlocked step. In both of these two embodiments, the divide by two circuit is enabled before switching the loop to the locked configuration. At block 1175, the oscillator driving the output of the phase-locked loop through the divider is adjusted so that its output frequency is within the range of the desired output frequency. At block 1180, the oscillator driving the output of the phase-locked loop is locked with the reference signal by setting the divider amount and connecting the driving oscillator to the feedback path of the phase-locked loop. Once the oscillator is locked, the method 1100 proceeds to block 1190 where the output of the phase-locked loop is no longer divided. For example, the output may no longer be divided by disabling the divide by two circuit 270.

Figure 12:
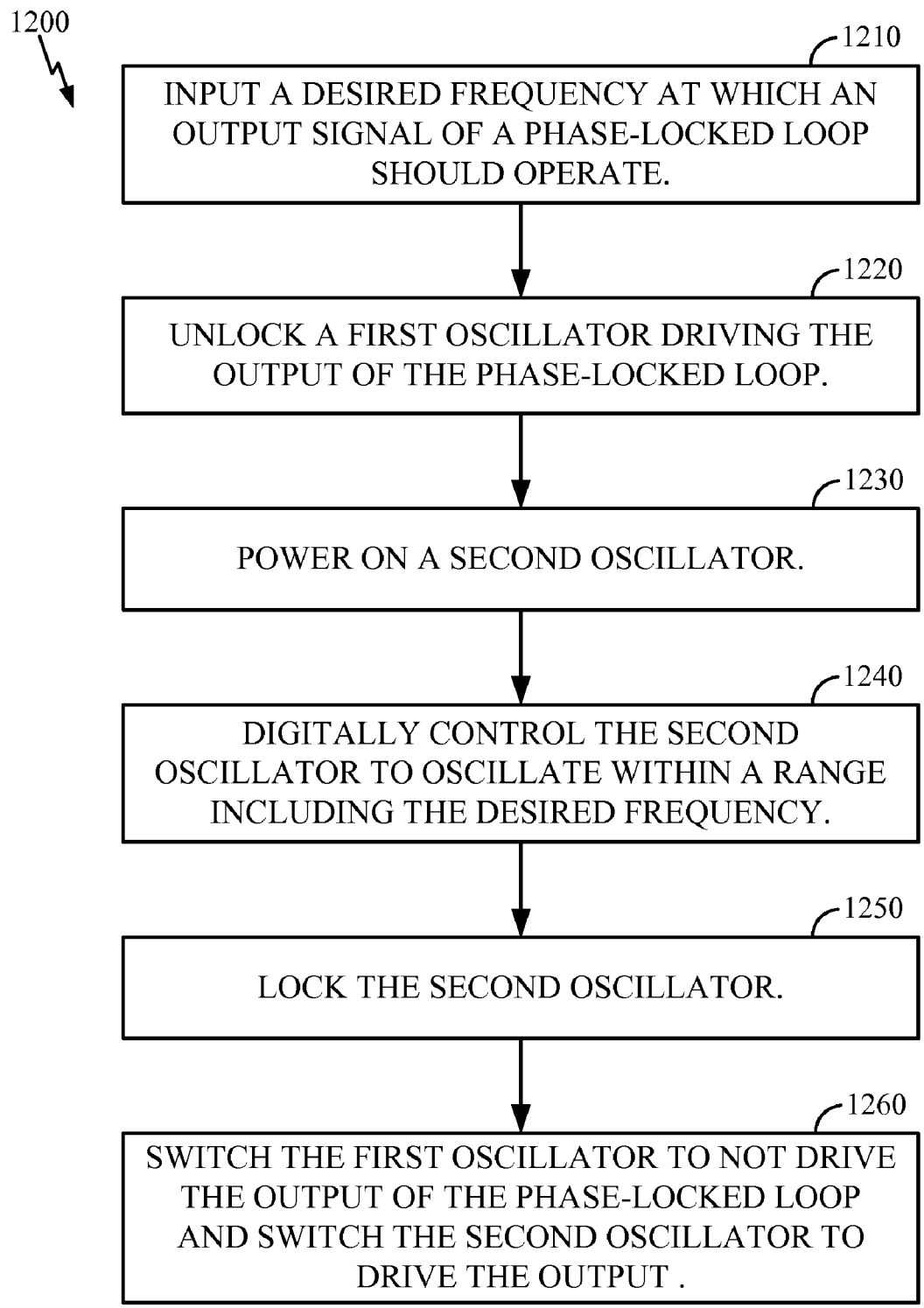
FIG. 12 is a flow chart illustrating a hop method for varying the frequency of the output of a phase-locked loop.

FIG. 12 is a flow chart illustrating a hop method 1200 for varying the frequency of the output of a phase-locked loop. At block 1210, a desired frequency at which the output of the phase-locked loop should operate is inputted. At block 1220, a first oscillator driving the output of the phase-locked loop is unlocked from a reference signal. At block 1230, a second oscillator is powered on. The second oscillator is not connected to drive the output of the phase-locked loop. At block 1240, the second oscillator is digitally controlled to oscillate within a range of frequencies including the desired frequency. At block 1250, the second oscillator is locked to a reference signal by connecting it independently from the first oscillator to a feedback path of the phase-locked loop. At block 1260, the first oscillator is switched to not drive the output of the phase-locked loop and the second oscillator is switched to drive the output of the phase-locked loop. Optionally, the first oscillator may then be powered down.

Figure 13:
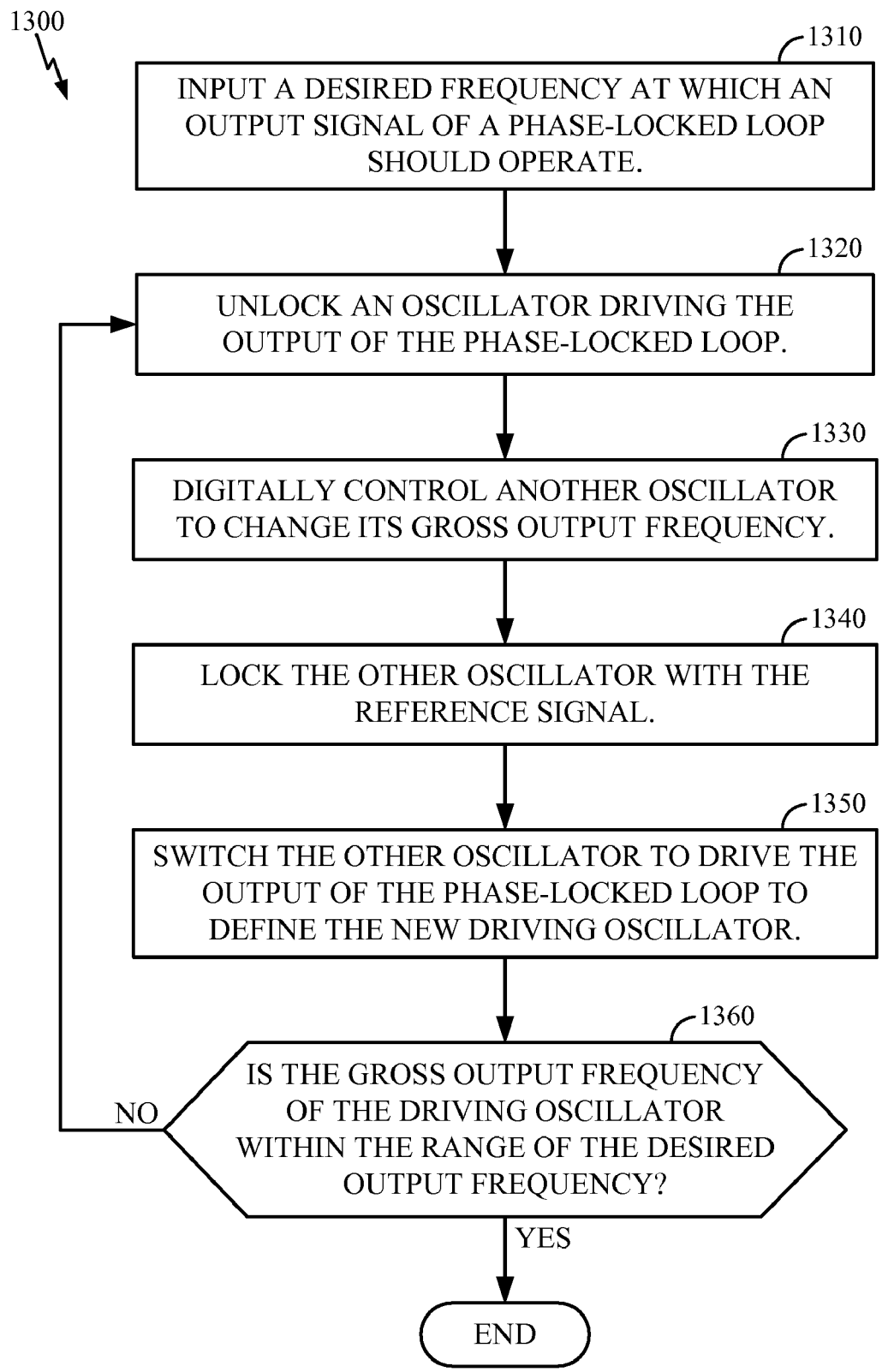
FIG. 13 is a flow chart illustrating a locked slew method for varying the frequency of the output of a phase-locked loop.

FIG. 13 is a flow chart illustrating a locked slew method for varying the frequency of the output of a phase-locked loop. At block 1310, a desired frequency at which an output signal of a phase-locked loop should operate is inputted. At block 1320, an oscillator driving the output of the phase-locked loop is unlocked from a reference signal. At block 1330, another oscillator is digitally controlled to change its gross output frequency. Depending on the desired direction of the slew of the output, the change may be to a higher or lower frequency. At block 1340, the other oscillator is locked with the reference signal. By way of example, the other oscillator is connected to the feedback path of the phase-locked loop. At block 1350, once locked, the other oscillator is switched to drive the output of the phase-locked loop. At block 1360, the method 1300 determines whether the gross output frequency of the driving oscillator is within the range of the desired output frequency. If it is, the method 1360 ends. If it is not, the method 1300 proceeds to block 1320 where the oscillator driving the output of the phase-locked loop is unlocked.

Figure 14:
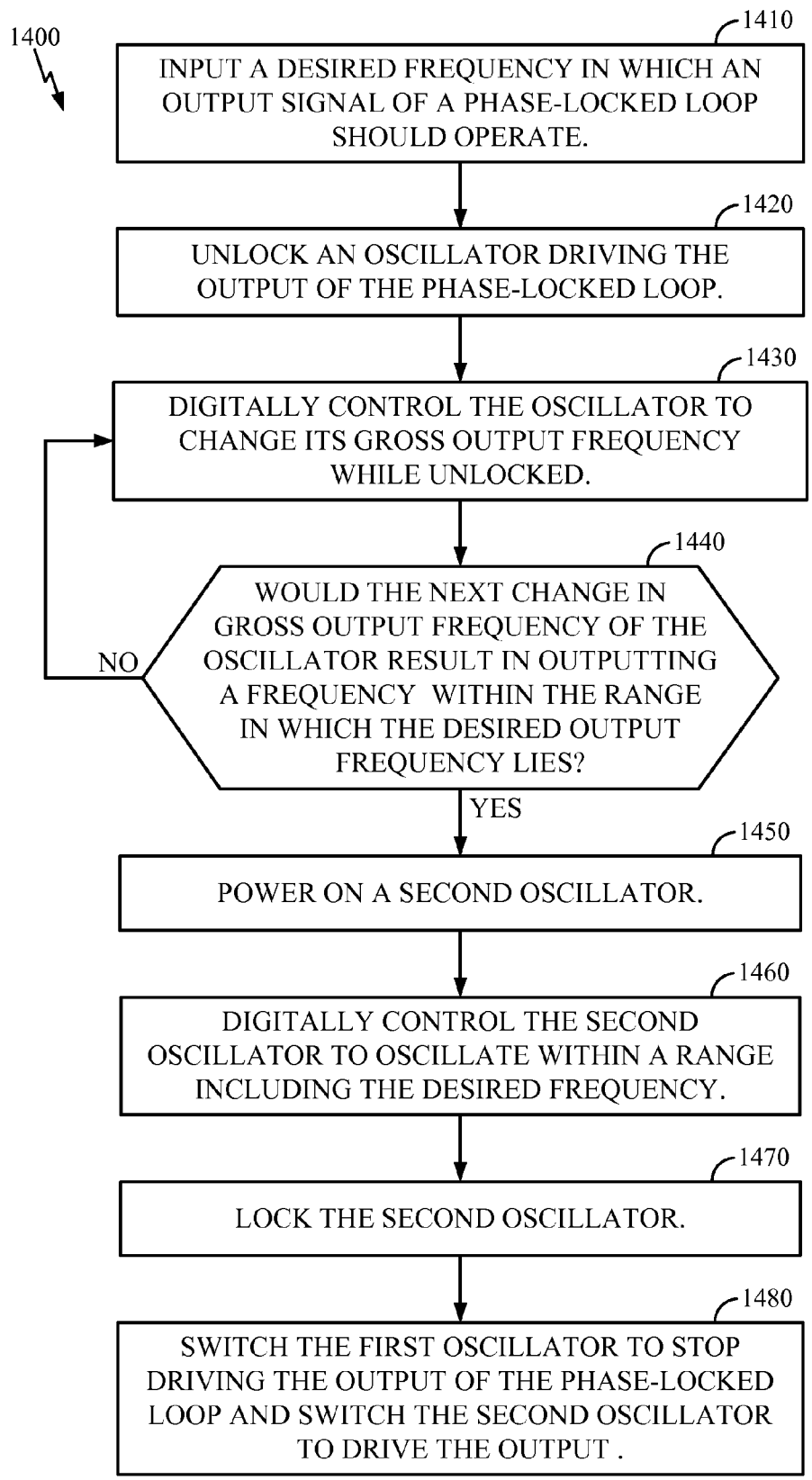
FIG. 14 is a flow chart illustrating a complex slew method for varying the frequency of the output of a phase-locked loop.

FIG. 14 is a flow chart illustrating a complex slew method 1400 for varying the frequency of the output of a phase-locked loop. At block 1410, a desired frequency at which an output signal of a phase-locked loop should operate is inputted. At block 1420, an oscillator driving the output of the phase-locked loop is unlocked from a reference signal. At block 1430, the oscillator is digitally controlled to change its gross output frequency while unlocked from the feedback path of the phase-locked loop. At block 1440, the method 1400 performs a lookahead function. In particular, it determines whether the next change in gross output frequency of the oscillator would result in outputting a frequency within the range in which the desired output frequency lies? If it does not, the method 1400 proceeds to block 1430 to change the gross output frequency while unlocked.

If it does, the method 1400 proceeds to block 1450 where a second oscillator is powered on. At block 1460, the second oscillator is digitally controlled to oscillate with a range including the desired frequency. At block 1470, the second oscillator is locked with the reference signal. At 1480, the first oscillator is switched to stop driving the output of the phase-locked loop and the second oscillator is switched to drive the output.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

The methods described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

While the invention is disclosed in the context of embodiments, it will be recognized that a wide variety of implementations may be employed by persons of ordinary skill in the art consistent with the above discussion and the claims which follow below.

What is claimed is:

1. A phase-locked loop comprising:
a clock output;
a plurality of oscillator complexes operable to generate output signals;
an output selector circuit configured to selectively couple an output signal of a first oscillator complex of the plurality of oscillator complexes to the clock output;
a frequency selector circuit configured to change a gross output frequency of the first oscillator complex from a first gross frequency range to a second gross frequency range while unlocked from a feedback path in response to a desired operating frequency of the output signals being within the second gross frequency range and wherein the gross output frequency of the first oscillator complex is changed while the output signal of the first oscillator complex remains coupled to the clock output; and
a switch configured to selectively couple the first oscillator complex to the feedback path, wherein a locked output results when the output selector circuit couples the output signal of the first oscillator complex to the clock output and the switch couples the first oscillator complex to the feedback path, and wherein an unlocked output results when the output selector circuit couples the output signal of the first oscillator complex to the clock output and the switch de-couples the first oscillator complex from the feedback path.

2. The phase-locked loop of claim 1 further comprising:
an input for receiving a reference signal; and wherein the feedback path is operative to lock a signal in phase with the reference signal, wherein the output selector circuit is further configured to selectively decouple the first oscillator complex from the feedback path and couple a second oscillator complex of the plurality of oscillator complexes to the feedback path when a next change in the gross output frequency is outside an operating frequency range of the first oscillator complex.

3. The phase-locked loop of claim 1 further comprising:
a multiplexer configured to couple the output of the first oscillator complex of the plurality of oscillator complexes to the clock output.

4. The phase-locked loop of claim 1 further comprising:
a divide-by-two circuit coupled to the output selector circuit, wherein the output selector circuit is further configured to activate the divide-by-two circuit to lower the frequency of the output signal while the first oscillator complex of the plurality of oscillator complexes locks to a higher frequency.

5. The phase-locked loop of claim 2 further comprising:
a multiplexer configured to couple the feedback path to the first oscillator complex of the plurality of oscillator complexes.

6. The phase-locked loop of claim 2 wherein the output selector circuit switches the plurality of oscillator complexes between driving the feedback path and the clock output to produce a simple slew operation.

7. The phase-locked loop of claim 2 wherein the output selector circuit switches the plurality of oscillator complexes between driving the feedback path and the clock output to produce a hop operation.

8. The phase-locked loop of claim 2 wherein the output selector circuit switches the plurality of oscillator complexes between driving the feedback path and the clock output to produce a locked slew operation.

9. The phase-locked loop of claim 2 wherein the output selector circuit switches the plurality of oscillator complexes between driving the feedback path and the clock output to produce a complex slew operation.

10. A phase-locked loop comprising:
an input for receiving a reference signal;
a clock output;
a feedback path for locking a signal in phase with the reference signal;
a plurality of oscillator complexes operable to generate output signals and separately couple to the feedback path and the clock output;
an output selector circuit configured to selectively couple an output signal of a first oscillator complex of the plurality of oscillator complexes to the clock output;
a frequency selector circuit configured to change a gross output frequency of the first oscillator complex from a first gross frequency range to a second gross frequency range while unlocked from a feedback path in response to a desired operating frequency of the output signals being within the second gross frequency range and wherein the gross output frequency of the first oscillator complex is changed while the output signal of the first oscillator complex remains coupled to the clock output; and
a switch configured to selectively couple the first oscillator complex to the feedback path, wherein a locked output results when the output selector circuit couples the output signal of the first oscillator complex to the clock output and the switch couples the first oscillator complex to the feedback path, and wherein an unlocked output results when the output selector circuit couples the output signal of the first oscillator complex to the clock output and the switch de-couples the first oscillator complex from the feedback path.

11. The phase-locked loop of claim 10 further comprising control logic, wherein the control logic is configured to selectively decouple the first oscillator complex from the feedback path and couple a second oscillator complex of the plurality of oscillator complexes to the feedback path when a next change in the gross output frequency of the first oscillator complex is outside an operating frequency range of the first oscillator complex.

12. A method of varying the frequency of the output of a phase-locked loop comprising:
inputting a desired frequency at which an output signal of the phase-locked loop should operate;
determining whether the desired frequency is within a gross output frequency range of an oscillator complex wherein the oscillator complex is selectively coupled to the feedback path via a switching element to enable a locked output when an output selector circuit couples an output signal of the oscillator complex to a clock output and the switching element couples the oscillator complex to the feedback path and to enable an unlocked output when the output selector circuit couples the output signal of the oscillator complex to the clock output and the switching element de-couples the oscillator complex from the feedback path;
decoupling the oscillator complex from a feedback path of the phase-locked loop when the desired frequency is not within the gross output frequency range of the oscillator complex;
adjusting a control of the decoupled oscillator complex to change the gross output frequency range to a second gross frequency range while unlocked from the feedback path and while the oscillator complex remains coupled to a clock output until the gross output frequency range of the oscillator complex is within a range of the desired frequency; and
coupling the oscillator complex to the feedback path to lock the output signal in phase with a reference signal when the output signal has a frequency within the range of the desired frequency.

13. The method of claim 12 further comprising:
repeating the adjusting step until the output signal has a frequency within the range of the desired frequency.

14. The method of claim 12 wherein the control of the decoupled oscillator complex is digital.

15. A method of varying the frequency of the output of a phase-locked loop comprising:
coupling a first oscillator complex to the output of the phase-locked loop, the first oscillator complex being decoupled from a feedback path of the phase-locked loop wherein the first oscillator complex is selectively coupled to the feedback path via a switching element to enable a locked output when an output selector circuit couples an output signal of the first oscillator complex to a clock output and the switching element couples the first oscillator complex to the feedback path and to enable an unlocked output when the output selector circuit couples the output signal of the first oscillator complex to the clock output and the switching element de-couples the first oscillator complex from the feedback path;
inputting a desired frequency at which an output signal of the phase-locked loop should operate;
changing a gross output frequency range of the first oscillator complex while decoupled from the feedback path and while the first oscillator complex remains coupled to the output of the phase-locked loop to a second gross frequency range when the desired frequency is outside the gross output frequency range of the first oscillator complex;
powering a second oscillator complex when a next change in the gross output frequency of the first oscillator complex is outside an operating frequency range of the first oscillator complex;
digitally controlling the second oscillator complex to generate a signal in a frequency range containing the desired frequency;
decoupling the first oscillator complex from the output of the phase-locked loop; and
coupling the second oscillator complex to the output of the phase-locked loop.

16. The method of claim 15, further comprising:
powering down the first oscillator complex after the first oscillator complex is decoupled from the output of the phase-locked loop.

17. The phase-locked loop of claim 11, wherein the control logic is further configured to selectively decouple the first oscillator complex over three or more oscillator cycles, wherein the control logic comprises a finite state machine configured to substantially eliminate a short cycle resulting when switching between the output signal of the first oscillator complex and an output signal of the second oscillator complex via a multiplexer.

* * * * *